(12) United States Patent
Hu et al.

(10) Patent No.: US 8,350,304 B2
(45) Date of Patent: Jan. 8, 2013

(54) JUNCTION-FIELD-EFFECT-TRANSISTOR DEVICES AND METHODS OF MANUFACTURING THE SAME

(75) Inventors: Chih-Min Hu, Kaohsiung (TW); Chung Yu Hung, Changhua County (TW); Wing Chor Chan, Hsinchu (TW); Jeng Gong, Taichung (TW)

(73) Assignee: Macronix International Co., Ltd., Hsin-Chu (TW)

( * ) Notice: Subject to any disclaimer, the term of this patent is extended or adjusted under 35 U.S.C. 154(b) by 182 days.

(21) Appl. No.: 12/795,486

(22) Filed: Jun. 7, 2010

(65) Prior Publication Data

US 2011/0220973 A1     Sep. 15, 2011

(30) Foreign Application Priority Data

Mar. 10, 2010   (TW) .............................. 99107011 A

(51) Int. Cl.
*H01L 29/66*     (2006.01)

(52) U.S. Cl. ................. 257/272; 257/371; 257/E27.067
(58) Field of Classification Search .................. 257/272, 257/371, E27.067
See application file for complete search history.

(56) References Cited

U.S. PATENT DOCUMENTS 6,750,527 B1 *  6/2004  Momohara .................... 257/511

\* cited by examiner

*Primary Examiner* — Tan N Tran
(74) *Attorney, Agent, or Firm* — Alston & Bird LLP

(57) ABSTRACT

A junction-field-effect-transistor (JFET) device includes a substrate of a first-type impurity, a first well region of a second-type impurity in the substrate, a pair of second well regions of the first-type impurity separated from each other in the first well region, a third well region of the first-type impurity between the pair of second well regions, a first diffused region of the second-type impurity between the third well region and one of the second well regions, and a second diffused region of the second-type impurity between the third well region and the other one of the second well regions.

5 Claims, 12 Drawing Sheets

JUNCTION-FIELD-EFFECT-TRANSISTOR DEVICES AND METHODS OF MANUFACTURING THE SAME

BACKGROUND OF THE INVENTION

The present invention generally relates to a semiconductor device and, more particularly, to a semiconductor junction-field-effect-transistor (JFET) device with a predetermined pinch-off voltage and a method of fabricating the same.

In a semiconductor JFET device, by controlling the voltages applied to its gate and drain terminals, depletion regions and currents may be induced. Taking an n-channel JFET as an example, in operation, a negative voltage $V_{GS}$ and a positive voltage $\backslash T_{DS}$ may be applied to the gate terminals and the drain terminal, respectively. As the negative voltage $V_{GS}$ goes lower and reaches a threshold level (termed as "pinch-off voltage, $V_P$"), the depletion regions may overlap each other in the channel region, resulting in a turn-off state of the JFET device. The pinch-off voltage $V_P$ may depend on the depth of the well region. However, it is difficult to precisely determine the depth of the well-region and in turn a desired pinch-off voltage $V_P$ during the fabricating process, as will be discussed below.

FIG. 1A is a schematic cross-sectional view of a JFET device 1-1 in prior art. Referring to FIG. 1A, when the gate terminals $G_1$, $G_2$ and the drain terminal D are biased at a negative voltage $V_{GS}$ and a positive voltage $V_{DS}$ respectively, depletion regions may be induced around the junctions between each P-well region and the N-type substrate, occupying portions of the channel region where an induced drain-to-source current $I_{DS}$ may flow. As the negative voltage $V_{GS}$ gets lower and reaches a pinch-off level, the channel region may be pinched by the depletion regions. Consequently, the drain-to-source current $I_{DS}$ may be largely reduced or switched off and the JFET device 1-1 may thus be turned off.

FIG. 1B is a schematic cross-sectional view illustrating a vertical-type JFET device 1-2 in prior art, wherein the drain region and the drain terminal are formed under the substrate. Referring to FIG. 1B, for such type of JFET device 1-2, the drain region is required to be precisely aligned with the source region formed on the substrate, which may need a complicated fabricating process. To address the issue, a lateral-type JFET device 1-3 has been developed.

FIG. 1C is a schematic cross-sectional view illustrating a lateral-type JFET device 1-3 in prior art. Referring to FIG. 1C, the source terminal S, the first, gate terminals $G_1$, $G_2$, and drain terminals $D_1$, $D_2$ are formed on the substrate. A depletion region may be induced around each of the junctions between the N-well region and the two P-well regions under the first and the second gate terminals $G_1$, $G_2$. When these terminals are appropriately biased, a first and a second current $I_1$ and $I_2$ may be induced, flowing in the N-well region, from drain terminals $D_1$ and $D_2$ to the source terminal S, respectively. The pinch-off voltage of the JFET device 1-3 may vary as the depth $H_0$ of the N-well region varies. Moreover, the depth of the N-well region may be susceptible to fabrication process. As a result, it may be difficult to design a JFET device with a desirable pinch-off voltage.

It may therefore be desirable to have a JFET device with a predetermined pinch-off voltage $V_P$. It may also be desirable to have a method of manufacturing such a JFET device.

BRIEF SUMMARY OF THE INVENTION

The present invention is directed to a semiconductor junction-field-effect-transistor (JFET) device and a method of manufacturing the same that may have a precisely-specified pinch-off voltage.

Examples of the present invention may provide a JFET device that includes a substrate of a first-type impurity, a first well region of a second-type impurity in the substrate, a second well region and a third well region of the first-type impurity separated from each other in the first well region, a fourth well region of the first-type impurity between the second well region and the third well region, a first diffused region of the second-type impurity between the second well region and the fourth well region, and a second diffused region of the second-type impurity between the third well region and the fourth well region.

Some examples of the present invention may provide a JFET device that includes a substrate, a patterned conductive layer including a source terminal on the substrate, a first well region in the substrate, a second well region and third well region separated from each other in the first well region, and a fourth well region under the source terminal between the second well region and the third well region in the first well region.

Examples of the present invention may also provide a JFET device that includes a substrate of a first-type impurity, a first well region of a second-type impurity in the substrate, a second well region and a third well region of the first-type impurity separated from each other in the first well region, a patterned conductive layer including a source terminal on the substrate, and a number of well regions of the first-type impurity under the source terminal between the second well region and the third well region.

Additional features and advantages of the present invention will be set forth in portion in the description which follows, and in portion will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, examples are shown in the drawings. It should be understood, however, that the invention is not limited to the precise arrangements and instrumentalities shown in the examples.

In the drawings:

FIG. 2A-2 is a schematic cross-sectional view of a JFET device in accordance with an example of the present invention;

DETAILED DESCRIPTION OF THE INVENTION

Reference will now be made in detail to the present examples of the invention illustrated in the accompanying drawings. Wherever possible, the same reference numbers will be used throughout the drawings to refer to the same or like portions. It should be noted that the drawings are in greatly simplified form and are not to precise scale.

Figure 2A:
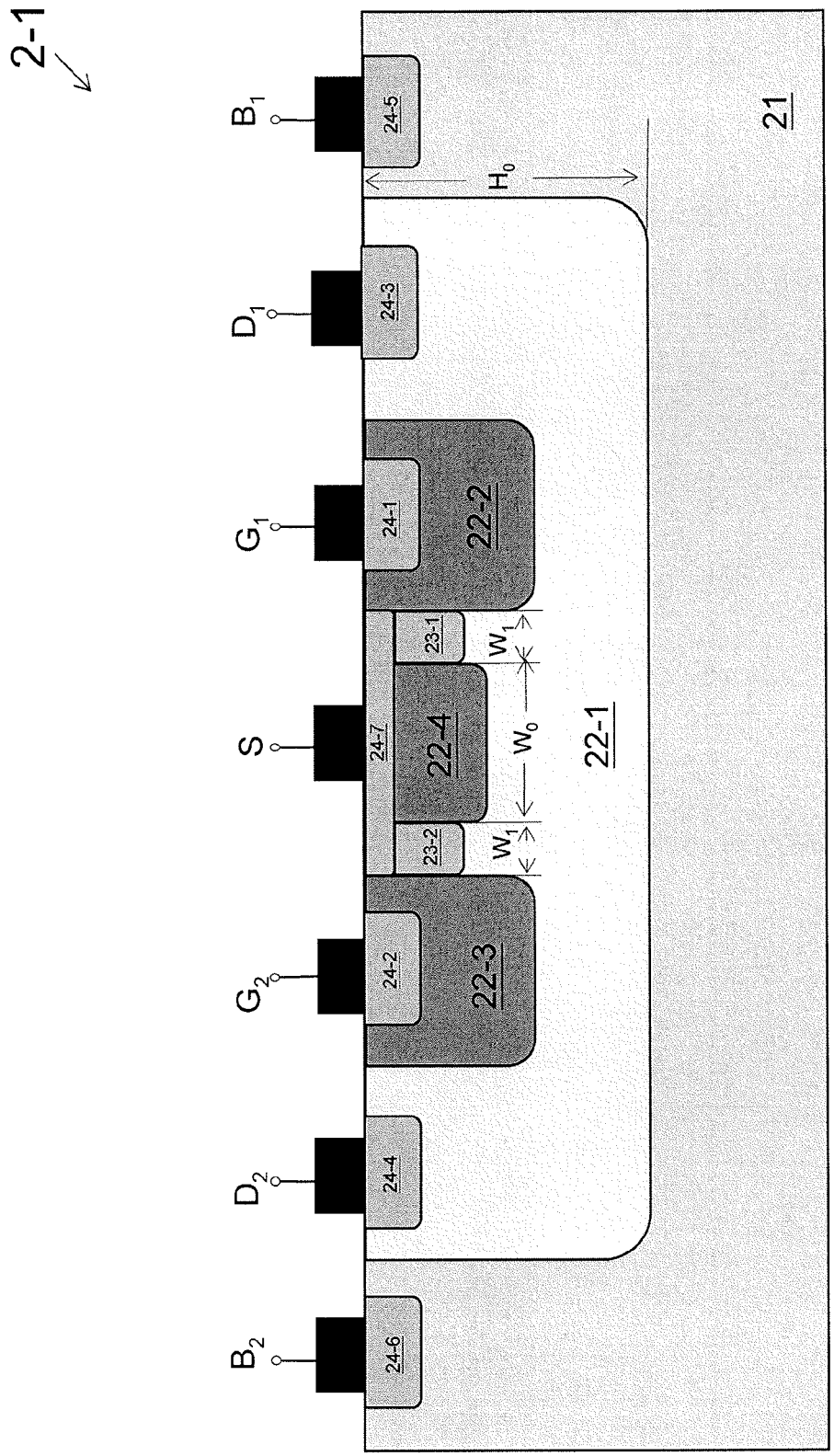
FIG. 2A is a schematic cross-sectional view of a JFET device in accordance with an example of the present invention.

FIG. 2A is a schematic cross-sectional view of a junction-field-effect-transistor (JFET) device 2-1 in accordance with an example of the present invention. The JFET device 2-1 may serve as an element in a semiconductor device that includes a plurality of such devices 2-1.

Referring to FIG. 2A, the JFET device 2-1 may include a substrate 21, a first well region 22-1 in the substrate 21, a second well region 22-2 in the first well region 22-1, a third well region 22-3 in the first well region 22-1 and a fourth well region 22-4 between the second well region 22-2 and third well region 22-3 in the first well region 22-1. Furthermore, the JFET device 2-1 may also include a first diffused region 23-1 between the second well region 22-2 and the fourth well region 22-4, a second diffused region 23-2 between the third well region 22-3 and the fourth well region 22-4, and a plurality of heavily doped regions 24-1 to 24-7, which may form an ohmic contact with their respective electrodes, as will be discussed in paragraphs below. The first well region 22-1 may have a depth of $H_0$ and the fourth well region 22-4 may be separated from each of the first diffused region 23-1 and the second diffused region 23-2 by a width of $W_1$.

The substrate 21 may include a first-type impurity, for example, a p-type impurity such as boron or indium. The first well region 22-1 may include a second-type impurity, for example, an n-type impurity such as phosphor or antimony. In one example, the second-type impurity in the first well region 22-1 may have a concentration ranging from approximately $10^{15}$ cm$^{-3}$ to $10^{18}$ cm$^{-3}$. Furthermore, each of the second well region 22-2, the third well region 22-3 and the fourth well region 22-4 may include the first-type impurity having a concentration ranging from approximately $10^{16}$ cm$^{-3}$ to $3 \times 10^{18}$ cm$^{-3}$. Furthermore, each of the first and the second diffused region 23-1 and 23-2 may include the second-type impurity having a concentration of approximately $10^{16}$ cm$^{-3}$ to $5 \times 10^{18}$ cm$^{-3}$.

Figures 2, 2A:
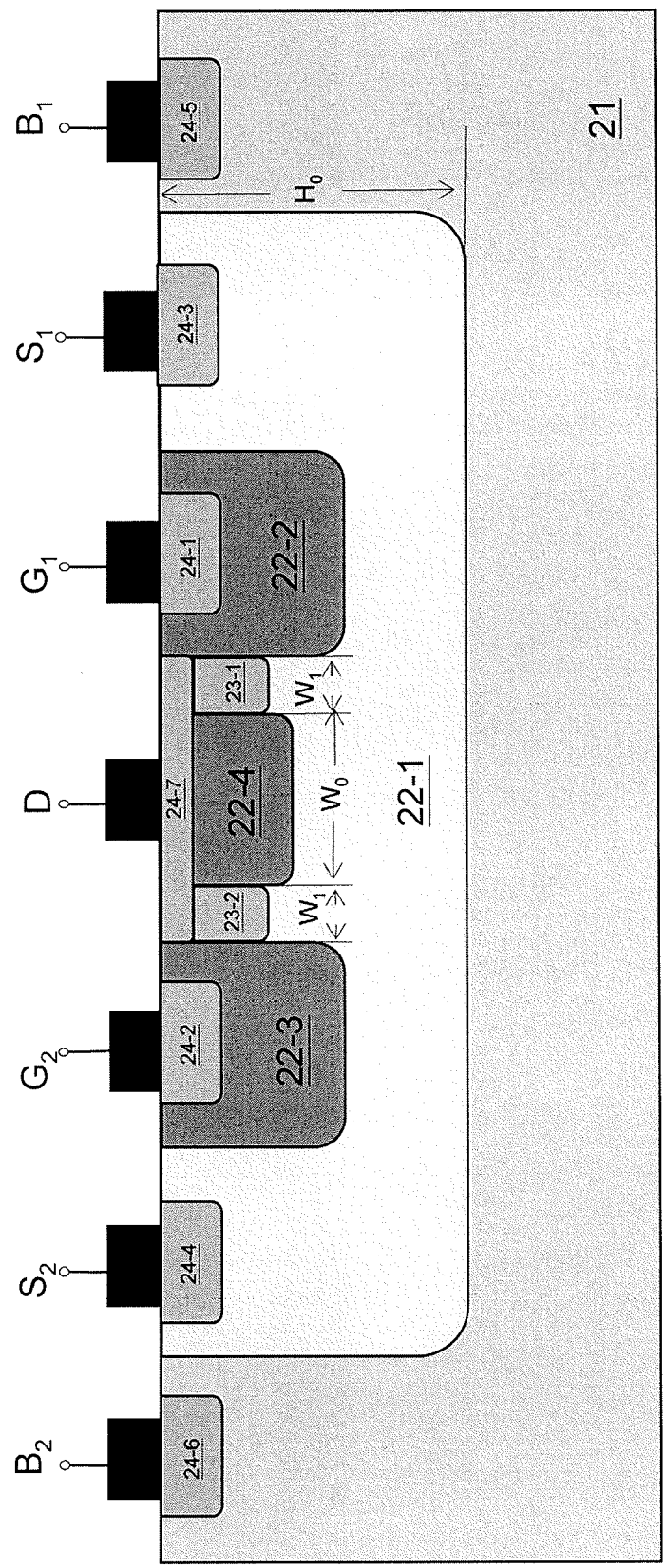

The heavily doped regions 24-1 and 24-2 may include the first-type impurity having a concentration ranging from approximately $10^{19}$ cm$^{-3}$ to $10^{20}$ cm$^{-3}$ in the second well region 22-2 and the third well region 22-3, respectively. The doped region 24-1 may serve as a first gate region associated with a first gate terminal $G_1$ and the doped region 24-2 may serve as a second gate region associated with a second gate terminal $G_2$. Furthermore, the heavily doped regions 24-3 and 24-4 may include the second-type impurity having a concentration ranging from approximately $10^{19}$ cm$^{-3}$ to $10^{20}$ cm$^{-3}$ in the first well region 22-1, and may serve as a first drain region associated with a first drain terminal $D_1$ and a second drain region associated with a second drain terminal $D_2$, respectively. Moreover, the heavily doped regions 24-5 and 24-6 may include the first-type impurity having a concentration ranging from approximately $10^{19}$ cm$^{-3}$ to $10^{20}$ cm$^{-3}$ in the substrate 21, and may serve as a first bulk contact region and a second bulk contact region, respectively. Moreover, the heavily doped region 24-7 may include the second-type impurity having a concentration ranging from approximately $10^{19}$ cm$^{-3}$ to $10^{20}$ cm$^{-3}$ over the fourth well region 22-4 between the second well region 22-2 and the third well region 22-3, and may serve as a channel region. The heavily doped region 24-7 may form an ohmic contact with a source terminal S. However, a person skilled in this art will understand that, the source terminal S and the drain terminals $D_1$ and $D_2$ may be interchangeable, For example, referring to FIG. 2A-2, The heavily doped regions 24-3 and 24-4 may also serve as a first source region associated with a first source terminal $S_1$ and a second source region associated with a second source terminal $S_2$, respectively, and the terminal over the heavily doped region 24-7 may therefore serve as a drain terminal D.

Figure 2B:
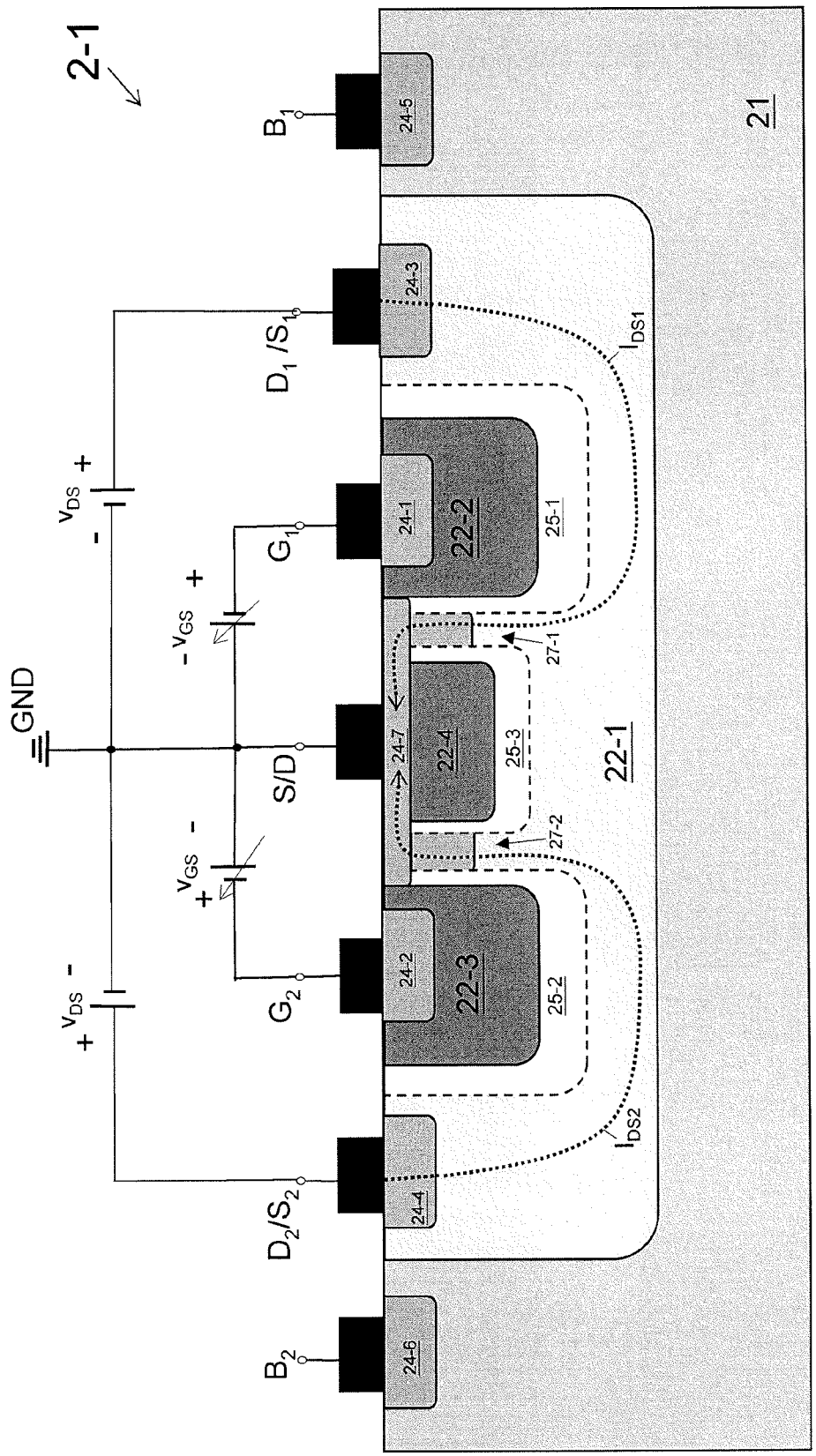
FIGS. 2B and 2C are schematic cross-sectional views illustrating the operation of the JFET device illustrated in FIG. 2A.
Figure 2C:
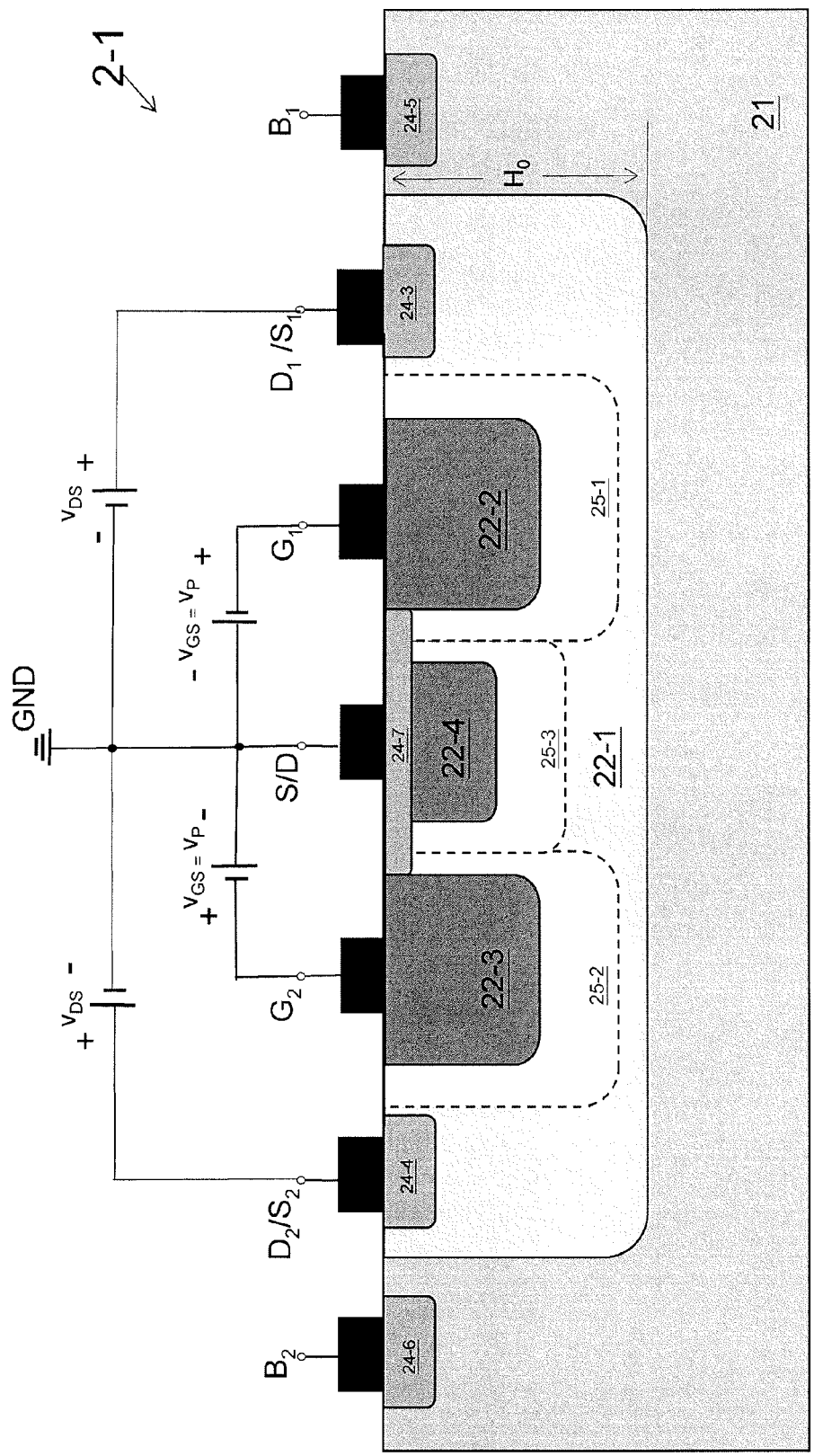

FIGS. 2B and 2C are schematic cross-sectional views illustrating the operation of the JFET device 2-1 illustrated in FIG. 2A. Referring to FIG. 2B, the JFET device 2-1 may operate when the source terminal S (or the drain terminal D) is coupled to a ground or reference level, the first gate terminal $G_1$ and the second gate terminal $G_2$ are biased at a negative voltage $V_{GS}$, and the first drain terminal $D_1$ (or the first source terminal $S_1$) and the second drain terminal $D_2$ (or the second source terminal $S_2$) are biased at a positive voltage $V_{DS}$. By applying the negative voltage $V_{GS}$ and the positive voltage $V_{DS}$, depletion regions and currents may be induced in the first well region 22-1.

Specifically, a first depletion region 25-1 may be formed across the p-n junction between the first well region 22-1 and the second well region 22-2. Likewise, a second depletion region 25-2 may be formed across the p-n junction between the first well region 22-1 and the third well region 22-3. Also, a third depletion region 25-3 may be formed across the p-n junction between the first well region 22-1 and the fourth well region 22-4. Consequently, a portion of the first well region 22-1 between the fourth well region 22-4 and the second well region 22-2 may be occupied by the first depletion region 25-1 and the third depletion region 25-3, leaving a first tunnel region 27-1 therein. Moreover, a portion of the first diffuse region 23-1 between the fourth well region 22-4 and the third well region 22-3 may be occupied by the second depletion region 25-2 and the third depletion region 25-3, leaving a second tunnel region 27-2 therein.

Moreover, a first current $I_{DS1}$ may be induced, flowing from the first drain terminal $D_1$ (or the first source terminal $S_1$) via the heavily doped region 24-3, the first tunnel region 27-1, the channel region 24-7 to the source terminal S (or the drain terminal D). Likewise, a second current $I_{DS2}$ may be induced, flowing from the second drain terminal $D_2$ (or the second source terminal $S_2$) via the heavily doped region 24-4, the second tunnel region 27-2 and the channel region 24-7 to the source terminal S (or the drain terminal D). The dimension of the induced depletion regions 25-1 to 25-3 and the magnitude of the induced currents $I_{DS1}$ and $I_{DS2}$ may vary as the negative voltage $V_{GS}$ varies.

Referring to FIG. 2C, as the negative voltage $V_{GS}$ goes lower, the depletion regions 25-1 to 25-3 may expand within the first well region 22-1. More particularly, the first depletion region 25-1 may expand and occupy more of the first well region 22-1 and the first tunnel region 27-1, while the second depletion region 25-2 may expand and occupy more of the first well region 22-1 and the second tunnel region 27-2. Meanwhile, the third depletion region 25-3 may expand and occupy more of the first well region 22-1, the first tunnel region 27-1 and the second tunnel region 27-2. When the negative voltage $V_{GS}$ becomes much lower and reaches a threshold voltage, i.e., the pinch-off voltage $V_P$, the first tunnel region 27-1 may be totally occupied and therefore pinched-off by the first depletion region 25-1 and the third depletion region 25-3. Likewise, the second tunnel region 27-2 may be totally occupied and therefore pinched-off by the second depletion region 25-2 and the third depletion region 25-3. Since the first tunnel region 27-1 and the second tunnel region 27-2 are pinched-off, the first current $I_{DS1}$, the second current $I_{DS2}$ and hence the overall current $I_{DS}$, i.e., a summation of the first current $I_{DS1}$ and the second current $I_{DS2}$, may decrease to an insignificant magnitude. For example, the current $I_{DS}$ may be smaller than $10^{-9}$ ampere (A). As a result, the JFET device 2-1 was turned off.

Figure 1A:
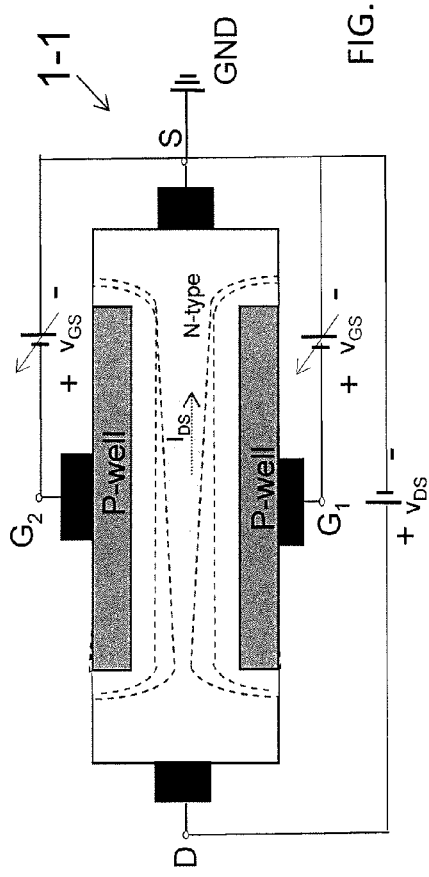
FIG. 1A to 1C are schematic cross-sectional views of junction-field-effect-transistor (JFET) devices in prior art.
Figure 1B:
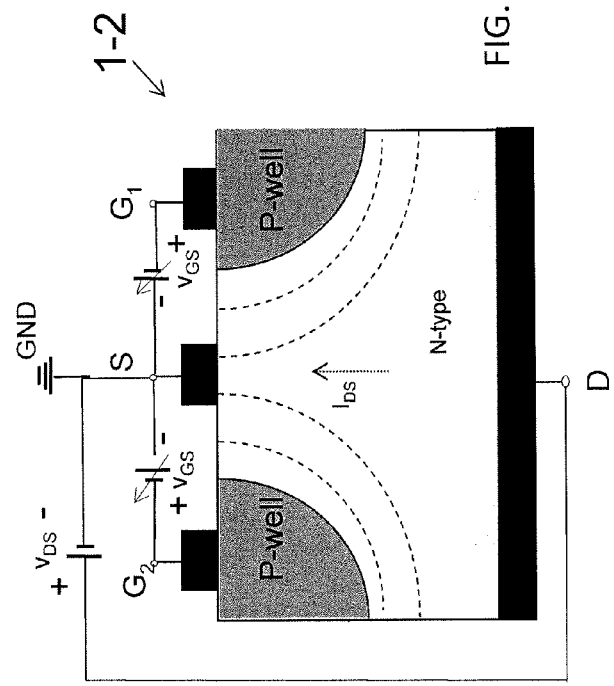
Figure 1C:
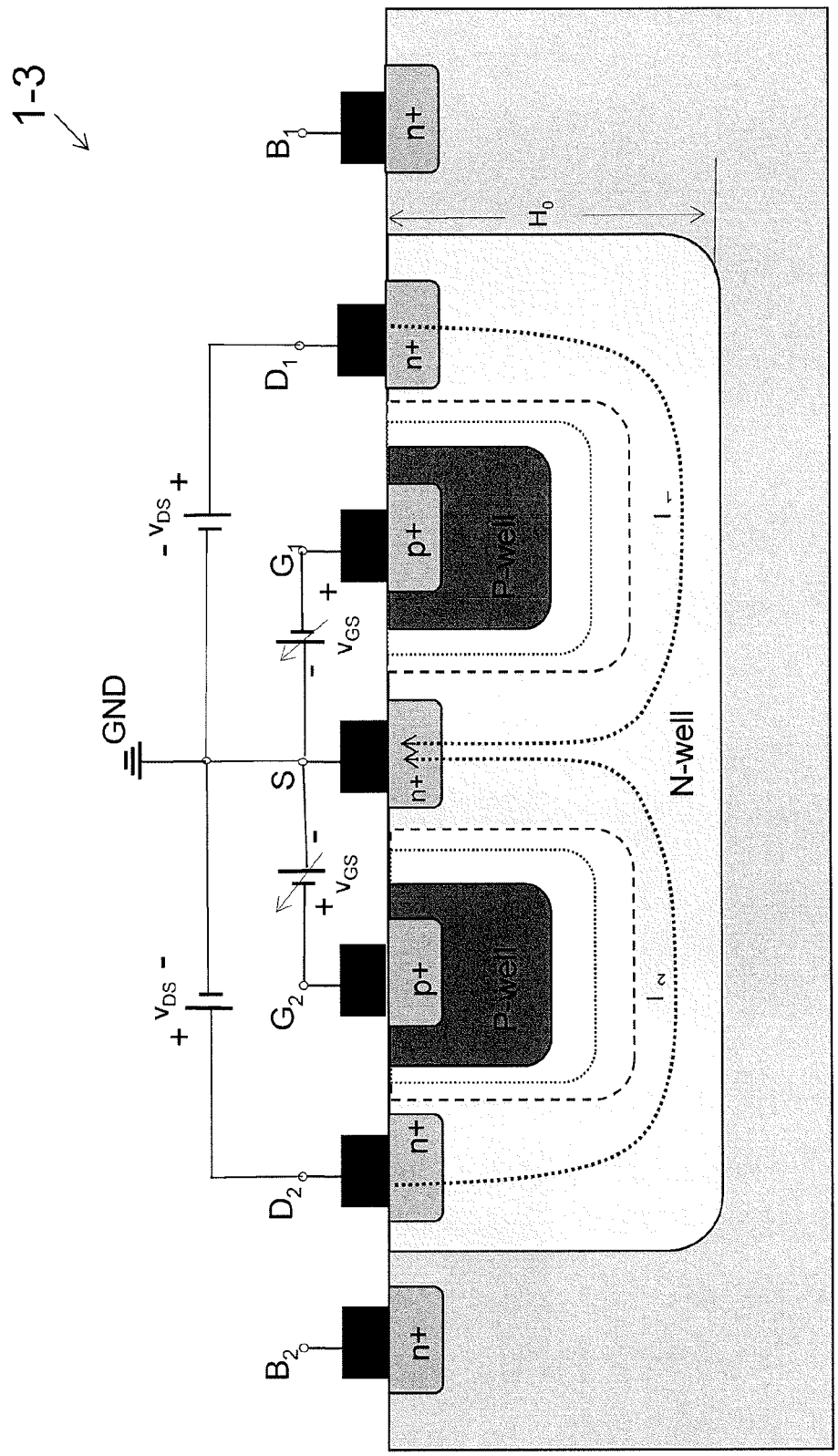

The pinch-off voltage $V_P$, referring back to FIG. 2A, may vary with the width $W_0$ of the fourth well region 22-4 or the width $W_1$ of the first diffused region 23-1 and the second diffused region 23-2. That is, the pinch-off voltage of the JFET device 2-1 is a function of the width $W_0$ or $W_1$. Furthermore, the width $W_0$ or $W_1$ may be determined by a mask for forming the well regions and diffused regions in a lithography process. In one example according to the present invention, given a 0.5-um fabrication process, when the width $W_0$ of the fourth well region 22-4 is approximately 5 micro-meters (um) or the width $W_1$ of the first diffused region 23-1 and the second diffused region 23-2 is approximately 1 um, the pinch-off voltage $V_P$ may be approximately −3 volts (V). Furthermore, when the width $W_1$ is approximately 2 um, the pinch-off voltage $V_P$ may be approximately −12V. Moreover, when the width $W_1$ is approximately 3 um, the pinch-off voltage $V_P$ may be approximately −20V. Accordingly, the device characteristics, for example, the pinch-off voltage $V_P$ of the JFET device 2-1, may be predetermined by designing the width $W_0$ or $W_1$ with a desired value. Comparing the conventional JFET device 1-3 in FIG. 1C of which the pinch-off voltage is determined by the depth $H_0$ of the N-well region in a vertical direction, the JFET device 2-1 in accordance with the present invention may achieve a desirable pinch-off voltage by controlling the lithography process in forming the well regions 22-2 to 22-4 and hence the width $W_0$ or $W_1$ in a horizontal direction. Furthermore, as the pinch-off voltage of a JFET device may change as the width $W_0$ or $W_1$ changes, in one example according to the present invention, a plurality of JFET devices with different widths of $W_0$ or $W_1$ and thus different pinch-off voltages may be formed on a single wafer, which may facilitate the fabrication of a system-on-a-chip (SOC) device.

Figure 3A:
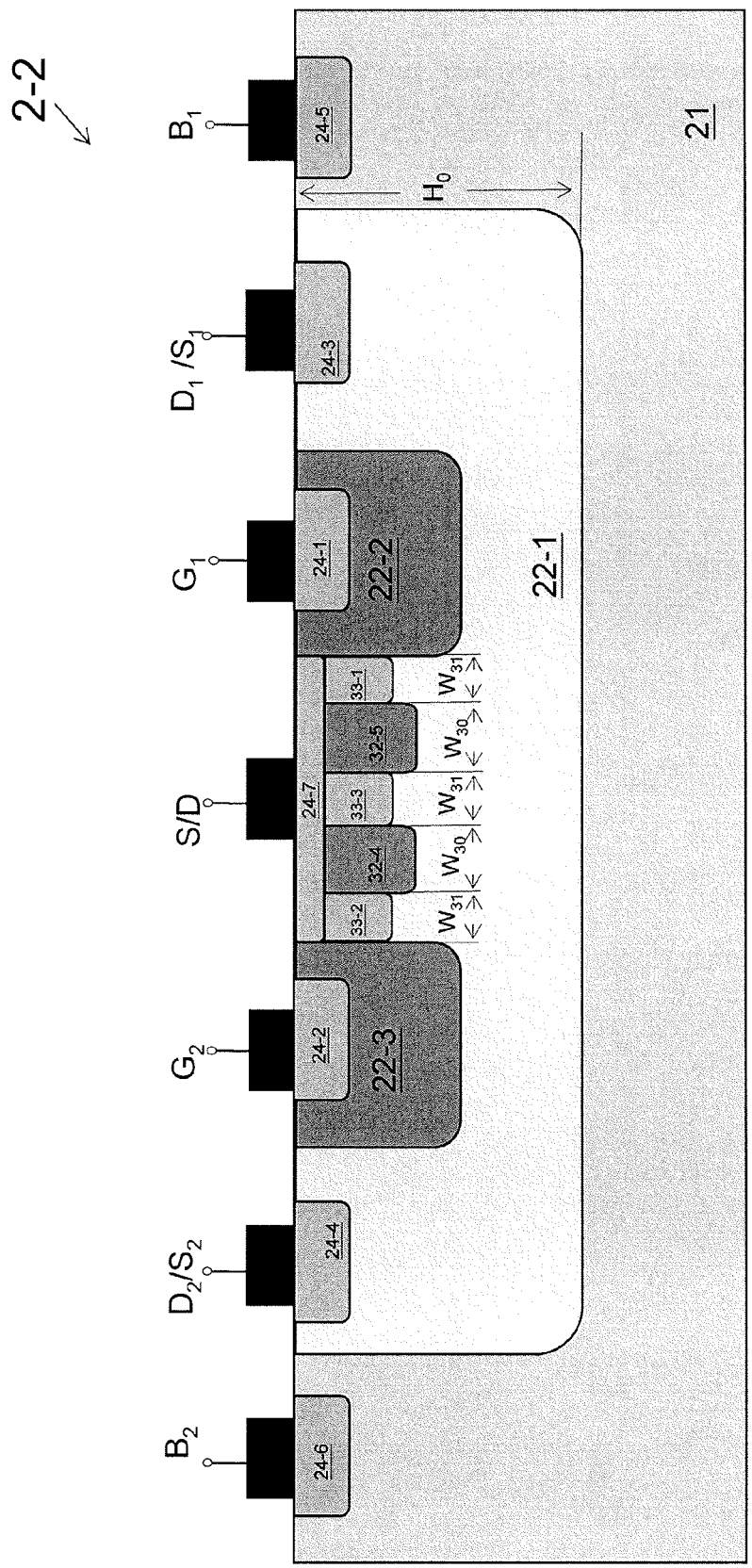
FIG. 3A is a schematic cross-sectional view of a JFET device in accordance with another example of the present invention.

FIG. 3A is a cross-sectional view of a JFET device 2-2 in accordance with another example of the present invention. Referring to FIG. 3A, the JFET device 2-2 may be similar to the JFET device 2-1 described and illustrated with reference to FIG. 2A except that, for example, well regions 32-4 and 32-5 of the first-type impurity between the second and third well regions 22-2 and 22-3 replace the fourth well region 22-4. Furthermore, diffused regions 33-1, 33-2 and 33-3 of the second-type impurity replace the first and second diffused regions 23-1 and 23-2. The diffused region 33-3 may be disposed substantially between the well regions 32-4 and 32-5. Moreover, the diffused region 33-1 may be disposed substantially between the well regions 32-5 and 22-2, and the diffused region 33-2 may be disposed substantially between the well regions 32-4 and 22-3.

In one example, the well regions 32-4 and 32-5 may each have a concentration ranging from approximately $10^{17}$ cm$^{-3}$ to $3\times10^{18}$ cm$^{-3}$ and a width of $W_{30}$. The diffused regions 33-1 to 33-3 may each have a concentration of approximately $10^{16}$ cm$^{-3}$ to $5\times10^{18}$ cm$^{-3}$ and a width $W_{31}$.

Figure 3B:
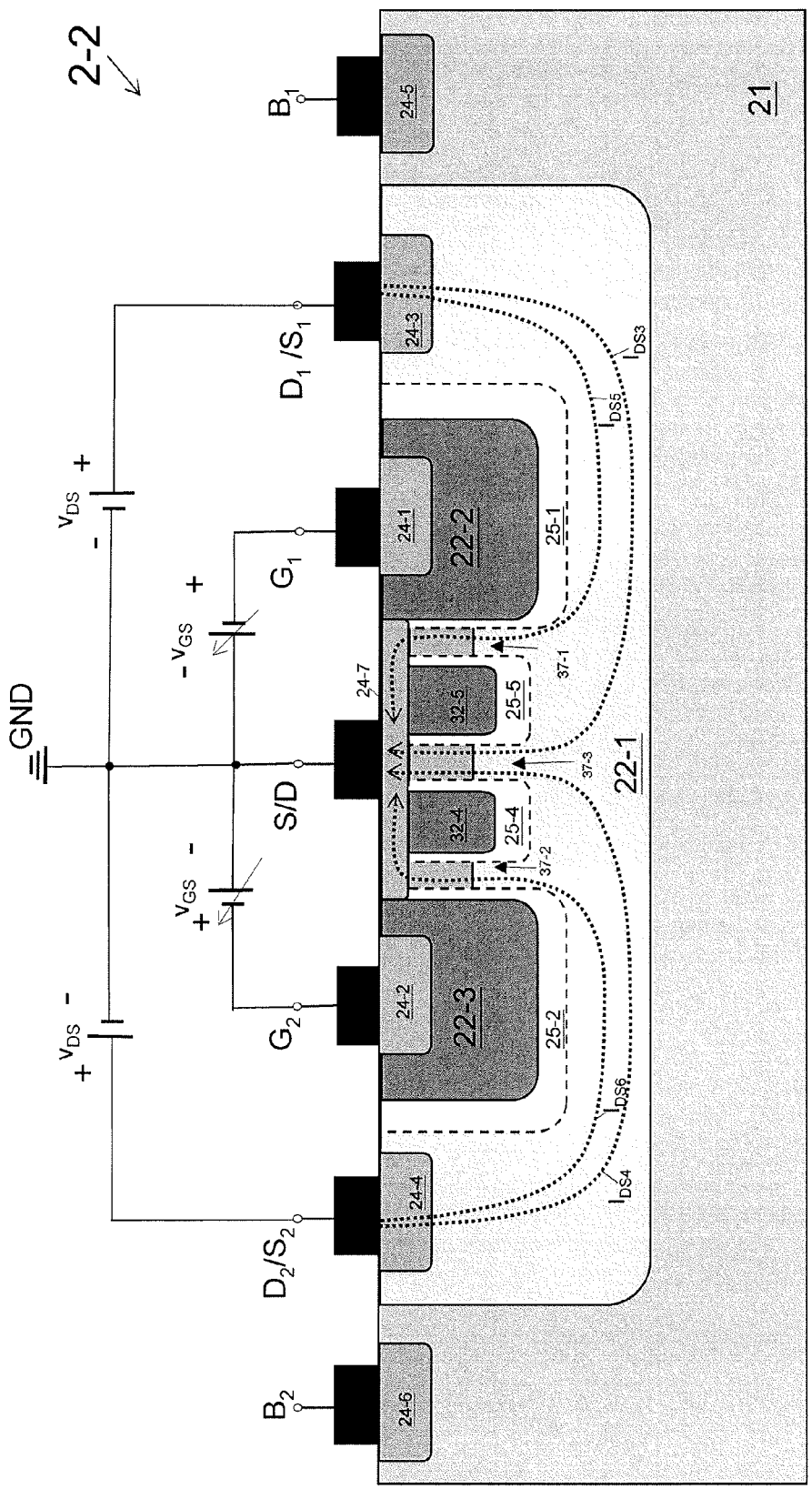
FIGS. 3B and 3C are schematic cross-sectional views illustrating the operation of the JFET device illustrated in FIG. 3A.
Figure 3C:
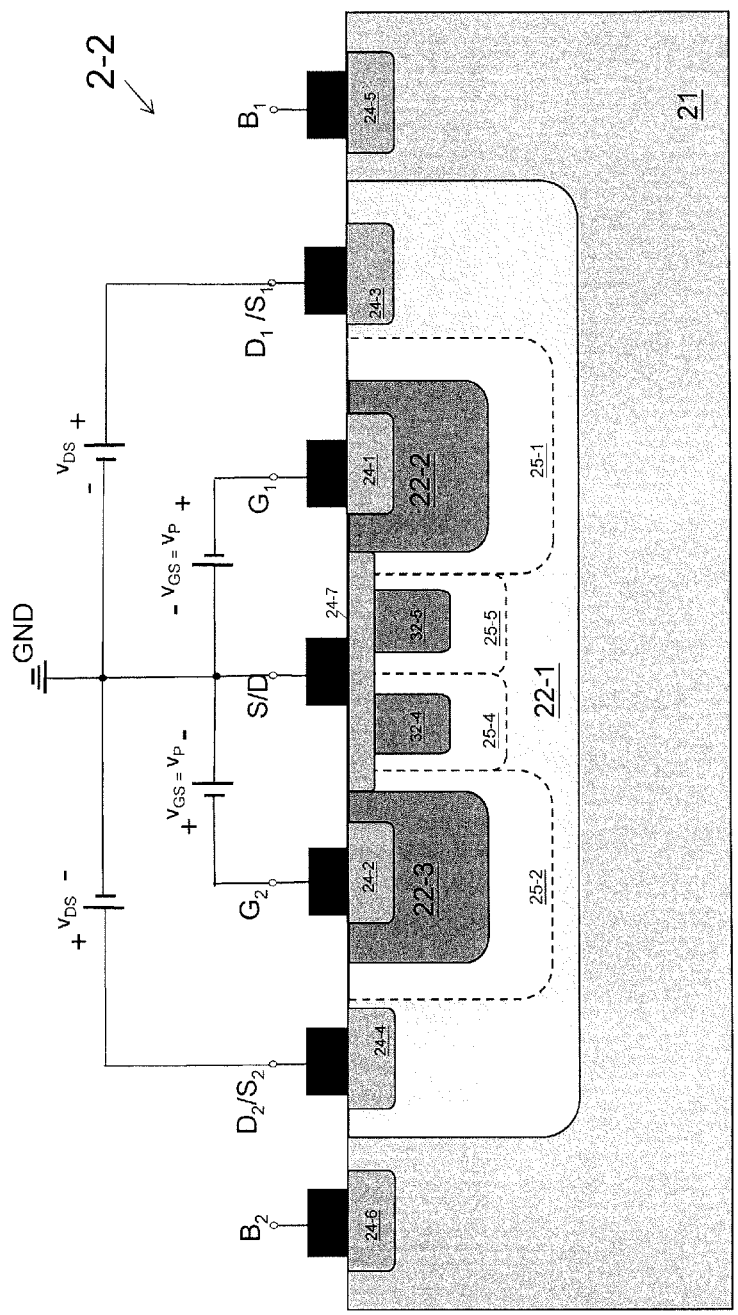

FIGS. 3B and 3C are schematic cross-sectional views illustrating the operation of the JFET device 2-2 illustrated in FIG. 3A. Referring to FIG. 3B, when appropriately biased, depletion regions 25-1, 25-2, 25-4 and 25-5 and currents $I_{DS3}$ to $I_{DS6}$ may be induced in the first well region 22-1. Specifically, the depletion region 25-4 may be formed across the p-n junction between the well regions 32-4 and 22-1. Similarly, the depletion region 25-5 may be formed across the p-n junction between the well regions 32-5 and the 22-1. Consequently, portions of the diffused region 33-1 may be occupied by the depletion regions 25-1 and 25-5, leaving a tunnel region 37-1. Similarly, portions of the diffused region 33-2 may be occupied by the depletion regions 25-4 and 25-2, leaving a tunnel region 37-2. Moreover, portions of the diffused region 33-3 may be occupied by the depletion regions 25-4 and 25-5, leaving a tunnel region 37-3.

The induced current $I_{DS3}$ may flow from the first drain terminal $D_1$ (or the first source terminal $S_1$) via the heavily doped region 24-3, the tunnel region 37-3 and the heavily doped region 24-7 to the source terminal S (or the drain terminal D). Likewise, the induced current $I_{DS4}$ may flow from the second drain terminal $D_2$ (or the second source terminal $S_2$) via the heavily doped region 24-4, the tunnel region 37-3 and the heavily doped region 24-7 to the source terminal S (or the drain terminal D). Moreover, the induced current $I_{DS5}$ may flow from the first drain terminal $D_1$ (or the first source terminal $S_1$) via the heavily doped region 24-3, the tunnel region 37-1 and the heavily doped region 24-7 to the source terminal S (or the drain terminal D). Furthermore, the induced current $I_{DS6}$ may flow from the second drain terminal $D_2$ (or the second source terminal $S_2$) via the heavily doped region 24-4, the tunnel region 37-2 and the heavily doped region 24-7 to the source terminal S (or the drain terminal D). Herein, the overall current $I_{DS}$ may be defined as a summation of the induced currents $I_{DS3}$ to $I_{DS6}$.

Referring to FIG. 3C, as the negative voltage $V_{GS}$ gets lower, the depletion regions 25-1, 25-2, 25-4 and 25-5 may expand and occupy more of the first well region 22-1 and the tunnel regions 37-1 to 37-3. When the negative voltage $V_{GS}$ reaches the pinch-off level $V_P$, the tunnel regions 37-1 to 37-3 may be totally occupied by the depletion regions and hence pinched-off, resulting in an insignificant current $I_{DS}$ less than $10^{-10}$ mA, which causes the JFET device 2-2 to turn off.

Similar to the JFET device 2-1, the pinch-off voltage $V_P$ of the JFET device 2-2 may vary as the width $W_{31}$ of the diffused regions 33-1, 33-2 and 33-3 varies or the width $W_{30}$ of the well regions 32-4 and 32-5 varies. Furthermore, the overall drain-to-source current $I_{DS}$ may be greater than that of the JFET device 2-1 because more currents $I_{DS4}$ to $I_{DS6}$ are induced. In the present example, two well regions 32-4 and 32-5 are formed under the doped region 24-7 between the second and third well regions 22-2 and 22-3. In other examples, however, three or more well regions may be formed under the doped region 24-7 between the second and third well regions 22-2 and 22-3. Accordingly, more depletion regions and currents may be induced.

Figure 4:
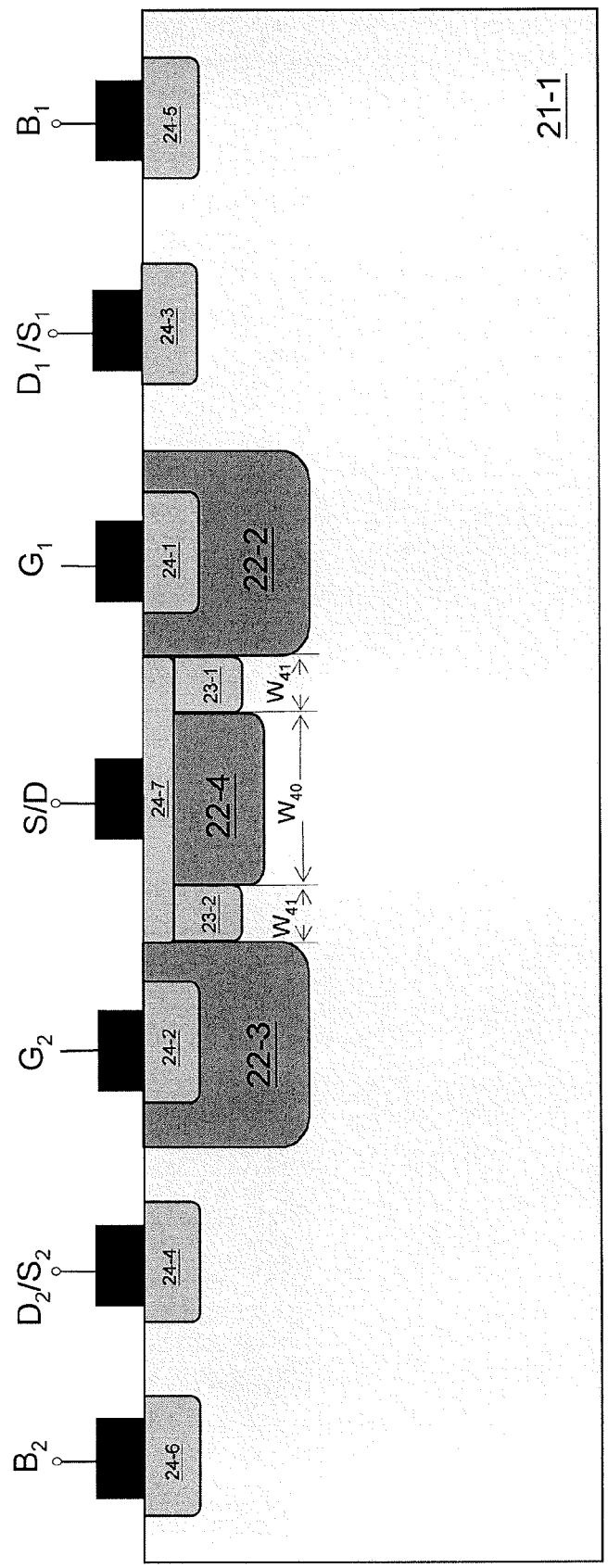
FIG. 4 is a schematic cross-sectional view of a JFET device in accordance with still another example of the present invention.

FIG. 4 is a cross-sectional view of a JFET device 2-3 in accordance with still another example of the present invention. Referring to FIG. 4, the JFET device 2-3 may be similar to the JFET device 2-1 described and illustrated with reference to FIG. 2A except that, for example, a substrate 21-1 of the second-type impurity replaces the substrate 21 of the first-type impurity. Furthermore, the first well region 22-1 of the second-type impurity of the JFET device 2-1 in FIG. 2A may be eliminated.

Figure 5A:
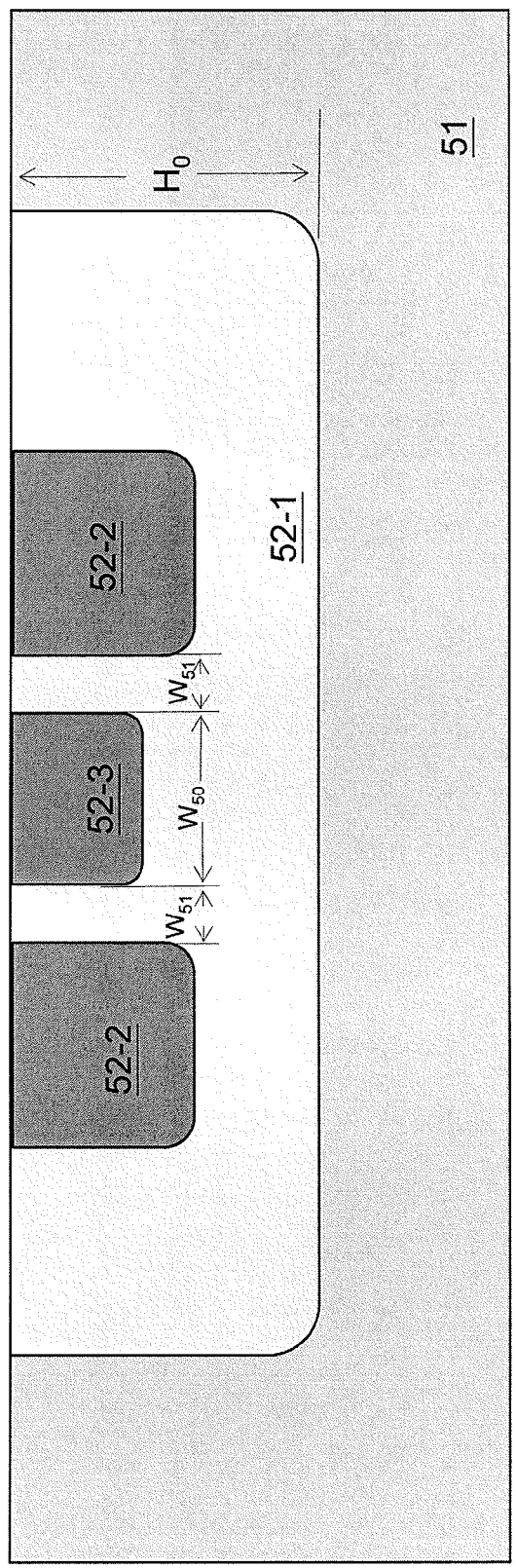
FIGS. 5A and 5B are schematic cross-sectional views illustrating a method of fabricating the JFET device illustrated in FIG. 2A.
Figure 5B:
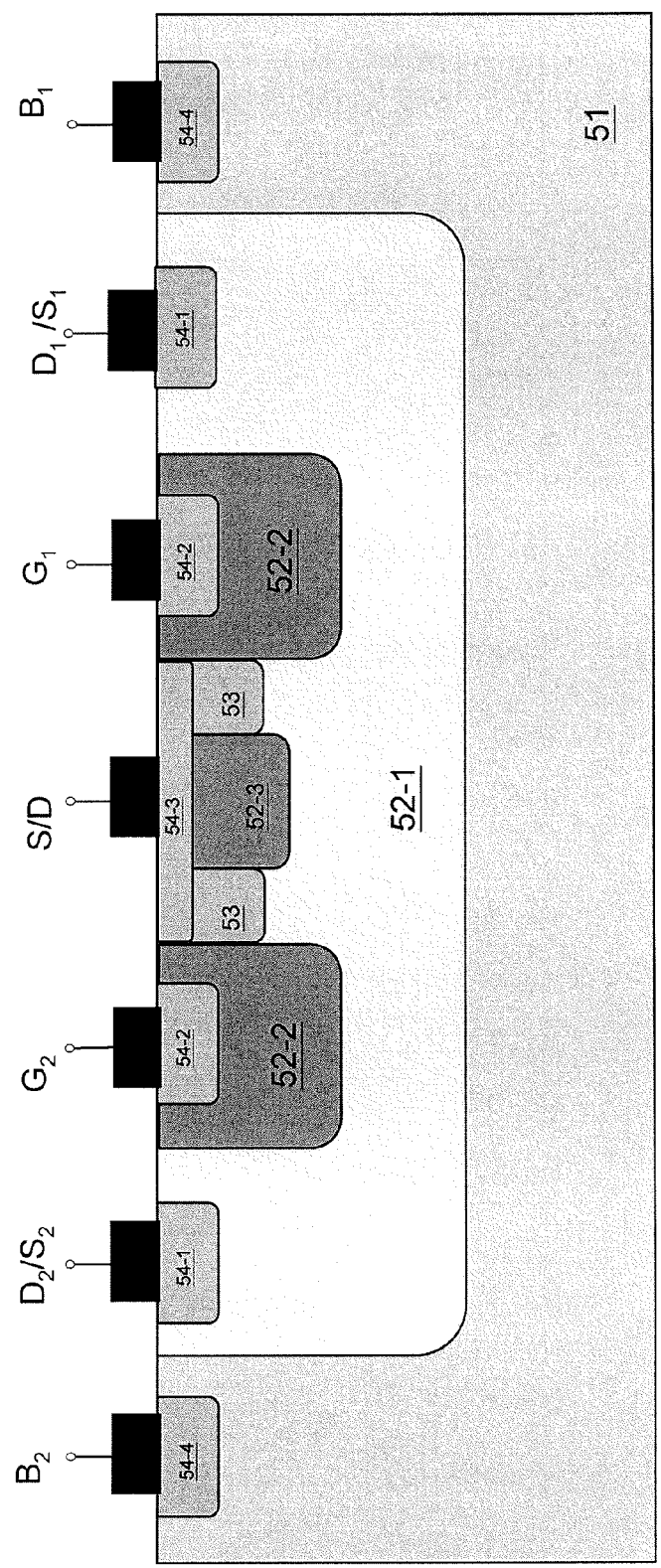

FIGS. 5A and 5B are schematic cross-sectional views illustrating a method of fabricating a JFET device 2-1 illustrated in FIG. 2A. Referring to FIG. 5A, a substrate 51 that has been doped with a first-type impurity, for example, a p-type impurity, may be provided. A portion of the substrate 51 may then be implanted with a second-type impurity, such as an n-type impurity which has a concentration ranging from approximately $10^{16}$ cm$^{-3}$ to $10^{18}$ cm$^{-3}$. The implanted second-type impurity may then be diffused into the substrate 51 with a depth of $H_0$, forming a first well region 52-1.

Next, portions of the first well region 52-1 may be implanted with the first-type impurity which has a concentration ranging from approximately $10^{17}$ cm$^{-3}$ to $3 \times 10^{18}$ cm$^{-3}$. The implanted first-type impurity may be thereafter diffused into the first well region 52-1, forming a pair of second well regions 52-2 separated from each other and a third well region 52-3 between the second well regions 52-2. The third well region 52-3 may have a width $W_{50}$. In one example, the distance between the pair of second well regions 52-2 may be predetermined so that when the width $W_{50}$ is determined, the distance $W_{51}$ between the third well region 52-3 and each of the second well regions 52-2 may be determined. In another example, the distance between the pair of second well regions 52-2 may be predetermined so that when the distance $W_{51}$ between the third well region 52-3 and each of the second well regions 52-2 is determined, the width $W_{50}$ of the third well region 52-3 may be determined. The width $W_{50}$ of the third well region 52-3 and the distance $W_{51}$ between the third well region 52-3 and each of the second well regions 52-2 may be determined by a mask using in a lithography process for forming the well regions and diffused regions. As previously discussed, the width $W_{50}$ or $W_{51}$ may determine the pinch-off voltage of a JFET device.

Referring to FIG. 5B, a pair of diffused regions 53 of the second-type impurity may be formed in the first well region 52-1. Specifically, the diffused regions 53 may each be formed substantially between the third well region 52-3 and one of the well regions 52-2.

Next, a plurality of doped regions may be formed. Specifically, a pair of doped regions 54-1 of the second-type impurity may be formed in the first well region 52-1, which may serve as ohmic contact associated with the drain terminals $D_1$ and $D_2$ (or the source terminals $S_1$ and $S_2$). Furthermore, a pair of doped regions 54-2 of the first-type impurity may be formed in the second well region 52-2, which may serve as ohmic contact associated with the gate terminals $G_1$ and $G_2$. Moreover, a pair of doped regions 54-4 of the second-type impurity may be formed in the substrate 51, which may serve as ohmic contact associated with the bulk terminals $B_1$ and $B_2$. Furthermore, a doped region 54-3 of the second-type impurity may be formed in the first well region 52-1 between the second well regions 52-2 over the third well region 52-3. In one example, the doped region 54-3 is longer than the third well region 52-3 between the second well regions 52-2. Subsequently, a patterned conductive layer, including the terminals $D_1$ (or $S_1$), $D_2$ (or $S_2$), $G_1$, $G_2$, $B_1$, $B_2$ and S (or D), may be formed on the substrate 51.

In another example, two or more third well regions 52-3 may be formed between the second well regions 52-2. In still another example, a substrate of the second-type impurity may be provided and the first well region 52-1 may be eliminated. In yet another example, a plurality of JFET devices may be formed, wherein the width $W_{50}$ or $W_{51}$ in a first JFET device is different from that of a second JFET device.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

Further, in describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A junction-field-effect-transistor (JFET) device comprising:
   a substrate of a first-type impurity;
   a first well region of a second-type impurity in the substrate;
   a second well region and a third well region of the first-type impurity separated from each other in the first well region,
   a fourth well region of the first-type impurity between the second well region and the third well region;
   a first diffused region of the second-type impurity between the second well region and the fourth well region;
   a second diffused region of the second-type impurity between the third well region and the fourth well region;
   a pair of first doped regions of the second-type impurity in the first well region, and a pair of second doped regions of the first-type impurity in the second well region and the third well region respectively;
   a third doped region of the second-type impurity in the first well region between the second well region and the third well region over the fourth well region; and
   a patterned conductive layer including a pair of drain terminals on the pair of first doped regions, a pair of gate terminals on the pair of second doped regions, and a source terminal on the third doped region.

2. The JFET device of claim 1, wherein the source terminal is to couple to a ground voltage, the pair of gate terminals are to couple to a negative voltage, and the pair of drain terminals are to couple to a positive voltage so that depletion regions are to be formed across junctions between the second, the third, the fourth well regions and the first well region respectively.

3. The JFET device of claim 1, wherein a width of the fourth well region is determined based on a predetermined pinch-off voltage of the JFET device.

4. The JFET device of claim 1, wherein a distance between the fourth well region and the second well region is determined based on a predetermined pinch-off voltage of the JFET device.

5. The JFET device of claim 1, wherein a distance between the fourth well region and the third well region is determined based on a predetermined pinch-off voltage of the JFET device.

* * * * *